United States Patent
Otremba

(10) Patent No.: US 8,084,861 B2
(45) Date of Patent: Dec. 27, 2011

(54) CONNECTION STRUCTURE SEMICONDUCTOR CHIP AND ELECTRONIC COMPONENT INCLUDING THE CONNECTION STRUCTURE AND METHODS FOR PRODUCING THE CONNECTION STRUCTURE

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 555 days.

(21) Appl. No.: 11/460,170

(22) Filed: Jul. 26, 2006

(65) Prior Publication Data

US 2007/0025684 A1 Feb. 1, 2007

(30) Foreign Application Priority Data

Jul. 28, 2005 (EP) .................................. 05016387

(51) Int. Cl.
*G02B 6/00* (2006.01)
(52) U.S. Cl. ........... 257/751; 257/E23.04; 257/E23.041; 257/E23.062; 257/692; 257/700; 257/750; 257/762; 257/771
(58) Field of Classification Search .................. 257/669, 257/686, 747, 751, 753, 762–765, 767, 772, 257/773, 690, 692, 700, 750, 771, E23.019, 257/E23.031, E23.041, E23.04, E23.062; 438/119, 123, 627, 628, 643, 644, 648, 650, 438/653, 654, 612; 428/620–623, 641, 644, 428/672, 673

See application file for complete search history.

(56) References Cited

U.S. PATENT DOCUMENTS

| | | | | |
|---|---|---|---|---|
| 3,657,611 A | | 4/1972 | Yoneda | 317/234 |
| 4,702,967 A | | 10/1987 | Black et al. | 428/620 |
| 4,929,516 A | * | 5/1990 | Pryor et al. | 428/620 |
| 5,510,650 A | * | 4/1996 | Erskine, Jr. | 257/707 |
| 5,559,817 A | | 9/1996 | Derkits, Jr. et al. | 372/36 |
| 5,901,901 A | | 5/1999 | Schneegans et al. | 228/254 |
| 6,147,403 A | * | 11/2000 | Matschitsch et al. | 257/751 |
| 6,300,167 B1 | | 10/2001 | Raleigh et al. | 438/122 |
| 6,727,587 B2 | | 4/2004 | Riedl | 257/748 |

FOREIGN PATENT DOCUMENTS

| | | |
|---|---|---|
| DE | 3406542 A1 | 8/1985 |
| DE | 3823347 A1 | 1/1990 |
| DE | 19528441 A1 | 9/1996 |
| DE | 19606101 A1 | 8/1997 |
| DE | 10124141 A1 | 4/2002 |
| JP | 08115928 | 5/1996 |

OTHER PUBLICATIONS

European Search Report and Written Opinion fro European Application No. EP 05 01 6387 (8 pages), Dec. 20, 2005.

* cited by examiner

*Primary Examiner* — Ha Tran T Nguyen
*Assistant Examiner* — Suberr Chi
(74) *Attorney, Agent, or Firm* — Banner & Witcoff, Ltd.

(57) ABSTRACT

Connection structure (5) for attaching a semiconductor chip (2) to a metal substrate (4) is provided which has a plurality of electrically conducting layers (11, 12, 13, 14) arranged in a stack. The stack has a contact layer (11) for providing an ohmic contact to a semiconductor chip (2), at least one mechanical decoupling layer (12) for mechanically decoupling the semiconductor chip (2) and the metal substrate (4), at least one diffusion barrier layer (13) and a diffusion solder layer (14) for providing a diffusion soldered mechanical bond and an electrical connection to a metal substrate (4). The mechanical decoupling layer (12) is positioned in the stack between the diffusion barrier layer (13) and the contact layer (11).

15 Claims, 1 Drawing Sheet

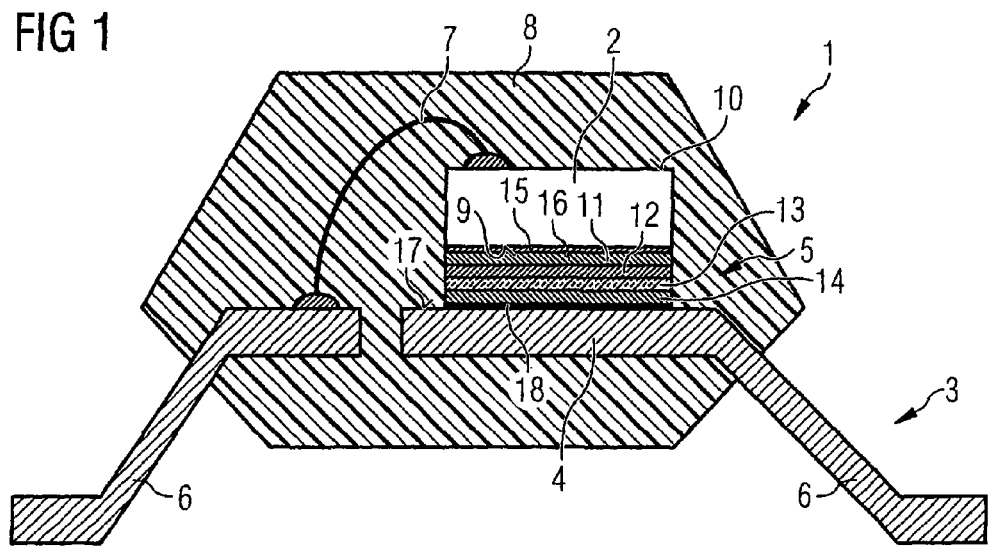
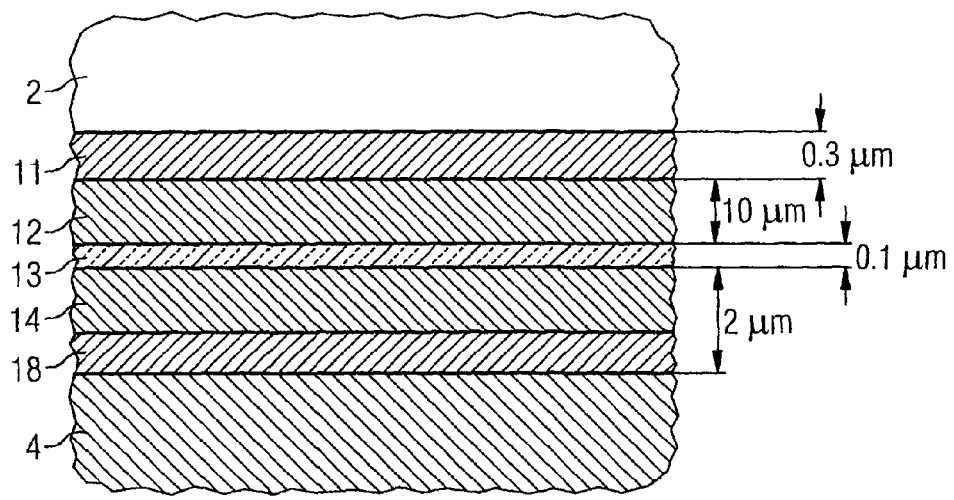

CONNECTION STRUCTURE SEMICONDUCTOR CHIP AND ELECTRONIC COMPONENT INCLUDING THE CONNECTION STRUCTURE AND METHODS FOR PRODUCING THE CONNECTION STRUCTURE

PRIORITY

This application claims priority from European Patent Application No. EP05016387.2, which was filed on Jul. 28, 2005, and is incorporated herein by reference in its entirety.

TECHNICAL FIELD

Semiconductor packages including a semiconductor chip mounted on a substrate suffer from the problem of crack formation at the interfaces between the different materials of the package. During thermal cycling of the component, stress occurs at the interfaces due to the difference in thermal expansion coefficient between the different materials, for example between the die pad of a metal leadframe and a semiconductor chip. This stress can lead to the formation of cracks and even to complete delamination of the chip from the die pad.

BACKGROUND

Thermal mismatch is also a problem for semiconductor chips which are mounted on a metal substrate by a diffusion solder technique. In these packages, the semiconductor chips are electrically connected to the metal substrate by the bond between the rear surface of the chip and the substrate. A diffusion solder bond has the advantage that a thin bond structure, for example around 10 µm, is provided. This improves thermal dissipation as well as enabling the size of the package to be reduced. However, as the bond structure is thin, it is less able to absorb the stress which occurs due to the mismatch in thermal expansion coefficients.

It is known from DE 101 24 141 A1 to position a buffer layer directly on the rear side of the semiconductor chip. However, the buffer layer also has to fulfill the function of producing an ohmic contact to the silicon chip. The contact function limits the number of metals which can be used since only a limited number fulfill this requirement. Since these materials are not optimised for providing a mechanical decoupling, the stress absorption which is possible is limited and the degree of mechanical decoupling between the semiconductor chip and the die pad is limited.

SUMMARY

In one embodiment, a connection structure for attaching a semiconductor chip to a metal substrate is provided which comprises a plurality of electrically conducting layers arranged in a stack. The stack comprises a contact layer for providing an ohmic contact to a semiconductor chip, at least one mechanical decoupling layer for mechanically decoupling the semiconductor chip and the substrate, at least one diffusion barrier layer for preventing diffusion between the mechanical decoupling layer and an adjacent layer and a diffusion solder layer for providing a diffusion soldered mechanical bond and an electrical connection to a metal substrate. The mechanical decoupling layer is positioned in the stack between the diffusion barrier layer and the contact layer.

BRIEF DESCRIPTION OF THE DRAWINGS

Embodiments will now be described with reference to the diagrams.

FIG. 1 shows a semiconductor package including a semiconductor chip mounted on a leadframe by a connection structure according to an embodiment, and FIG. 2 illustrates a detailed view of a connection structure according to a second embodiment.

DETAILED DESCRIPTION

A connection structure according to an embodiment may have the advantage that the functions of the different layers of the stack can be optimized separately. In particular, the functions of providing a good ohmic contact to the semiconductor chip and a mechanical decoupling of the semiconductor chip from the substrate may now be provided separately by different layers in the stack. Therefore, a material which provides a good ohmic contact to the semiconductor chip may be chosen and a second different material which has good mechanical decoupling properties but poor contact properties may be chosen for the mechanical decoupling layer. Furthermore, the thickness of the different layers in the stack can be optimised independently.

The arrangement of the mechanical decoupling layer within the stack between the diffusion barrier layer and the contact layer may have the further advantage that stress can effectively be absorbed by the mechanical decoupling layer so that stress on the contact layer and stress at the interface between the contact layer and the semiconductor chip may be reduced.

It should be understood that the contact layer may comprise two or more layers and include an additional adhesion or diffusion barrier layer at the interface to the semiconductor chip. Additionally, the diffusion barrier layer may also include an adhesion layer or adhesion layers in order to improve the adhesion to the adjacent layers in the stack.

The connection structure also may provide an improvement over the arrangement of a mechanical decoupling layer positioned directly on the metal substrate. Diffusion can occur between the mechanical decoupling layer and the metal contact so that the thickness of the mechanical decoupling layer is reduced during the bonding treatment. The thickness and, therefore, the mechanical decoupling effect is non-uniform.

Additionally, further diffusion between the layers can occur over the lifetime of the structure due to the heat dissipated by the chip. This causes the thickness of the mechanical decoupling layer to decline and its effectiveness to be reduced over time. This problem may also be avoided by such a connection structure.

In an embodiment, the mechanical decoupling layer is in direct contact with the diffusion barrier layer and in direct contact with the contact layer. This structure has the advantage that the number of layers required to build the connection structure is minimized which simplifies the manufacturing process.

In a further embodiment, the stack includes two diffusion barrier layers and the mechanical decoupling layer is positioned between, and is in direct contact with, the two diffusion barrier layers. This is advantageous if diffusion occurs between the material of the mechanical decoupling layer and the contact layer, for example. The purity of the material of the contact layer does not deteriorate due to the presence of the diffusion barrier layer so that the electrical resistance of the contact layer is not affected. The performance of the component is consequently maintained over time.

The stack may also comprise two or more mechanical decoupling layers which are separated from each other by diffusion barrier layers. This arrangement has the advantage that the mechanical decoupling effect is distributed over two or more layers of a laminate structure which further improves the ability of the structure to absorb the effects of the mismatch in thermal expansion coefficients.

All of the layers in the stack comprise a metal or an alloy so that the connection structure can be reliably used for power semiconductor chips which dissipate larger amounts of heat. The contact layer may comprise Ti or Ni or Au or Pt or Cu or Pd. These metals provide an ohmic contact with silicon. The contact layer may, alternatively, consist essentially of Ti or Ni or Au or Pt or Cu or Pd. A highly pure metal layer has the advantage that the electrical resistance of the layer is reduced.

The mechanical decoupling layer may consist essentially of Al or Ag. Both of these metals provide a good mechanical decoupling and have the advantage that, when arranged in the stack, they behave in a similar manner to a liquid. This behaviour has been observed to increase over time so that, instead of a reduction in the mechanical decoupling over time, as is observed in the prior art stacks, the mechanical decoupling provided by the connection structure can actually improve.

The barrier layer may comprise Ti or a Ti layer and TiN adhesion layer. These materials provide an effective diffusion barrier.

In an embodiment, the diffusion solder layer consists essentially of a diffusion solder material which forms intermetallic phases with the material of the metal substrate at a temperature of approximately 230° C. to approximately 280° C. This temperature range has the advantage that the semiconductor chip can be attached to the metal substrate without being damaged by the heat treatment process.

A diffusion solder bond is formed by the formation of intermetallic phases between the diffusion solder layer and the substrate when the interface between the two materials is heated to a certain temperature. However, the intermetallic phases which are formed have a melting point which is higher than the temperature at which the bond or joint was formed. Therefore, the joint is stable to a higher temperature than the temperature at which it was formed. Therefore, in the case of bonding a semiconductor chip to a substrate, materials are chosen for the diffusion solder layer and metal substrate which form intermetallic phases at a temperature of approximately 230° C. to approximately 280° C. The diffusion solder layer may comprise AuSn or AgSn or InSn or CuSn and the die pad may comprise copper or a copper alloy.

In an embodiment, the contact layer has a thickness of less than 1 μm. This is sufficient to provide a good ohmic contact to the semiconductor chip. The mechanical decoupling layer has a thickness of 0.1 μm to 10 μm. The thickness of the mechanical decoupling layer can be varied to provide the mechanical decoupling desired for a particular combination of materials or for particular operating conditions. If a higher degree of mechanical decoupling is desired, the thickness of the layer is increased. The diffusion barrier layer has a thickness of less than 0.1 μm. This is sufficient to provide a good diffusion barrier. The diffusion solder layer has a thickness of less than 10 μm. This thickness enables a good diffusion solder bond to be formed between the diffusion solder layer and the metal substrate.

After the semiconductor chip has been attached to the die pad by a diffusion soldering process, the diffusion solder layer may have a thickness less than its as-deposited thickness. The diffusion solder layer may no longer be present in the connection structure between the semiconductor chip and the substrate of a package if the bonding conditions are chosen so that all of the diffusion solder layer reacts to form intermetallic phases.

In this embodiment, the connection structure within the package comprises a contact layer, at least one mechanical decoupling layer, at least one diffusion barrier layer and an intermetallic layer. The intermetallic layer is directly bonded with the die pad and the contact layer is in direct contact with the semiconductor chip. The mechanical decoupling layer is positioned in the stack between the diffusion barrier layer and the contact layer and provides a mechanical decoupling between the intermetallic layer and the semiconductor chip. This is advantageous since the intermetallic layer may be relatively brittle.

Also, a semiconductor chip with the connection structure of one of the embodiments already described disposed on its rear side may be provided. The contact layer is disposed directly on the rear side of the semiconductor chip. The diffusion solder layer, therefore, provides the free surface of the connection structure. The semiconductor chip, preferably, comprises silicon and the metal substrate, preferably, comprises copper or a copper alloy. The semiconductor chip may comprise a vertical power device, the vertical power device being one of the group consisting of an IGBT, a MOSFET, a Schottkey-Diode and a PIN-Diode.

The connection structure is particularly suitable for packages in which a large amount of heat is dissipated by the chip. The connection structure is, therefore, particularly suitable for power semiconductor packages.

The metal substrate may be the die pad of a leadframe. The leadframe may comprise copper or a copper alloy. A leadframe is preferred for power semiconductor chips as the heat can be more effectively dissipated with the aid of the metal of the leadframe. Alternatively, the metal substrate may be the die attach area of a rewiring substrate.

Furthermore, a method for producing a connection structure for attaching a semiconductor chip to a metal substrate which comprises the following steps is provided. A contact layer for providing an ohmic contact to a semiconductor chip is deposited. A mechanical decoupling layer for mechanically decoupling the semiconductor chip and the substrate is deposited. A diffusion barrier layer for preventing diffusion between the mechanical decoupling layer and a bonding layer is deposited and a diffusion solder layer for providing a diffusion soldered mechanical bond and an electrical connection to a metal substrate is deposited. The layers are deposited such that the mechanical decoupling layer is positioned between the diffusion barrier layer and the contact layer.

The connection structure, therefore, comprises a plurality of electrically conductive layers arranged in a stack which is built up by sequentially depositing one layer on top of another. Consequently, the layers are deposited in the order in which they are appear within the stack.

In an embodiment, the contact layer is deposited first. the mechanical decoupling layer is deposited on the contact layer, the diffusion barrier layer is deposited on the mechanical decoupling layer and the diffusion solder layer is deposited on the diffusion barrier layer.

In a further embodiment, a first diffusion barrier layer is deposited on the contact layer, the mechanical decoupling layer is deposited on the first diffusion layer, a second diffusion barrier layer is deposited on the mechanical decoupling layer and the diffusion solder layer is deposited on the second diffusion barrier layer.

The contact layer, the mechanical decoupling layer, the diffusion barrier layer and the diffusion solder layer of the interconnection structure may be deposited by thermal evaporation, e-beam evaporation, dc sputtering, rf sputtering. The deposition method can be chosen to optimise the quality and deposition speed for a particular desired metal or alloy. Each layer may be deposited using the same technique and may be carried out in the same deposition chamber without breaking the vacuum. Alternatively, the structure may be transferred to a further deposition chamber for the deposition of a subsequent layer. If different deposition techniques are to be used, then these may also be carried out in the same deposition chamber or the connection structure may be transferred to a further deposition chamber.

In an embodiment, the contact layer is deposited to a thickness of less than 1 μm, the mechanical decoupling layer to a thickness of 0.1 μm to 10 μm, the diffusion barrier layer to a thickness of less than 0.1 μm and the diffusion solder layer to a thickness of less than 10 μm.

In another embodiment, a method for mounting a semiconductor chip on a metal substrate comprises the following steps. A semiconductor chip is provided which includes a connection structure according to one of the embodiments previously described. The contact layer is disposed on the rear surface of the semiconductor chip and the diffusion solder layer provides the free surface of the connection structure.

The layers of the connection structure are, preferably, deposited on the rear surface of the semiconductor chip at the wafer level. This greatly simplifies the manufacturing process as well as increasing the production rate. After the desired layers have been deposited on the rear side of the wafer, the wafer is singulated to produce a plurality of semiconductor chips including the connection structure positioned on the rear side of the chips.

A metal substrate is provided onto which it is desired to mount the semiconductor chip. The semiconductor chip is placed on the metal substrate, and a heat treatment is performed to diffusion solder bond the semiconductor chip to the substrate.

As the semiconductor chip includes an outer diffusion solder layer, the heat treatment is performed under conditions such that intermetallic phases are formed at the interface between the diffusion solder layer and the metal substrate. The temperature, time and external pressure required to achieve a bond are, therefore, dependent on the combination of materials used.

In an embodiment, the heat treatment is carried out at a temperature of between approximately 230° C. to approximately 280° C. and intermetallic phases are formed at the interface between the diffusion solder layer and the metal substrate. This temperature range has the advantage that the semiconductor chip is not damaged at these temperatures.

In summary, a connection structure can be provided for attaching a semiconductor chip to a metal substrate in which the functions of the layers of the connection structure are separated. This may enable the function of the individual layers to be separately optimised. Therefore, the mechanical decoupling of the semiconductor chip and metal substrate can be improved without a deterioration in the thermal dissipation or electrical properties.

The mechanical decoupling layer is, therefore, positioned in the stack between the contact layer and the diffusion layer and is not in direct contact with either the semiconductor chip or with the metal substrate.

FIG. 1 shows a semiconductor package 1 including a semiconductor chip 2 and a leadframe 3 which includes a die pad 4 and a plurality of leadfingers 6. The semiconductor chip 1 is a power MOSFET device which comprises silicon and has a thickness of 300 μm. The rear side 9 of the semiconductor chip 1 includes the drain electrode of the MOSFET and is mounted on, and electrically connected to, the die pad 4 of the leadframe 3 by a connection structure 5 which comprises four layers. The upper side 10 of the semiconductor chip 1 is electrically connected to the leadfingers 6 of the leadframe by a plurality of bond wires 7. The semiconductor chip 1, die pad 4, bond wire 7 and inner portions of the leadfingers 6 are encapsulated in an epoxy resin 8 which provides the housing of the semiconductor package 1. The outer portions of the leadfingers 6 protrude from the plastic housing 8 and provide the external contacts of the package 1.

The connection structure 5 includes a contact layer 11, a mechanical decoupling layer 12, a barrier layer 13 and a diffusion solder layer 14.

The connection structure 5 has a first contact layer 11 which is disposed on the rear side 9 of the semiconductor chip 1. The contact layer 11 includes a TiN adhesion layer 15 and a Ti layer 16. The TiN layer 15 is disposed directly on the rear surface 9 of the semiconductor chip 1 and the Ti layer 16 is disposed on the TiN adhesion layer 15. The contact layer 11 has a thickness of 0.5 μm and provides an ohmic contact on the rear surface 9 of the semiconductor chip 1.

The mechanical decoupling layer 12 is provided by a layer of aluminium in a first embodiment. The aluminium layer 12 has a thickness of 5 μm. The mechanical decoupling layer 12 is disposed on the contact layer 11. The aluminium layer provides a mechanical decoupling of the semiconductor chip 1 from the die pad 4.

The barrier layer 13 is disposed on the mechanical decoupling layer 12. The barrier layer 13 provides a diffusion barrier between the mechanical decoupling layer 12 and the diffusion solder layer 14. The diffusion barrier layer 13 is a titanium layer with a thickness of 0.5 μm.

The diffusion solder layer 14 is disposed on the barrier layer 13 and comprises a AgSn layer with a thickness of 2 μm. As the semiconductor chip has been mounted on the upper surface 17 of the die pad 4 by a diffusion soldering process, intermetallic phases 18 are present at the interface between the die pad 4 and diffusion solder layer 14. Therefore, a diffusion solder layer 14 with a greater thickness than that which can be observed after the diffusion soldering process was deposited. The mechanical decoupling layer 12 also provides a mechanical decoupling effect between the intermetallic phases 18 and the semiconductor chip 2.

FIG. 2 shows a connection structure 5 according to a second embodiment. Parts of the connection structure 5 which are essentially the same as those of FIG. 1 are indicated by the same reference number. The connection structure 5 also comprises 4 layers.

A contact layer 11 is provided on the rear surface of the silicon chip by a layer of Pt with a thickness of 0.3 μm. A mechanical decoupling layer 12 is arranged on the contact layer 11. The mechanical decoupling layer 12 is provided by a layer of silver with a thickness of 10 μm. A barrier layer 13 provided by a 0.1 μm thick layer of Ti is arranged on the mechanical decoupling layer 12 and a diffusion solder layer 14, comprising 2 μm of InSn is provided on the diffusion barrier layer 13.

The mechanical decoupling layer 12 is not in direct contact with the rear surface 9 of the semiconductor chip 1 or with the upper surface 17 of the die pad 4. This enables the functions of the individual layers to be individually optimised.

The connection structure 5 was produced by vacuum deposition of the layers onto the rear surface of a silicon wafer. The rear surface is defined as the surface which is to be attached to the die pad. The upper surface includes contact pads which are to be electrically connected to the leadfingers of the leadframe by bond wires.

A contact layer 11 was deposited on the rear surface of the silicon chip to a thickness of 0.3 μm. A mechanical decoupling layer 12 was then deposited on the contact layer 11 to a thickness of 10 µm. A barrier layer was then deposited on the mechanical decoupling layer 12 and a diffusion solder layer 14, comprising 2 µm of InSn, was deposited on the diffusion barrier layer 13. The wafer was then singulated to provide a plurality of semiconductor chips 2 with the connection structure 5.

The semiconductor chip 2 was then attached to the die pad 4 by placing the diffusion solder layer 14 on the upper surface 17 of the die pad 4 and heating the semiconductor chip 2 and the die pad 4 such that intermetallic phases 18 are formed at the interface between the upper surface 17 of the die pad 4 and the diffusion solder layer 12. The semiconductor chip 2 is mechanically attached and electrically connected to the die pad 4 of the leadframe 3 by the intermetallic phases 18.

The thickness of the solder diffusion layer 14 in the connection structure 5 after the bonding process has been carried out is less than its as-deposited thickness due to the formation of the intermetallic phases. Depending on the bonding conditions used, all of the diffusion solder layer 14 may react to form intermetallic phases 18. In this embodiment, the connection structure 5 comprises a contact layer 11 disposed on the rear surface 9 of the semiconductor chip 2, a mechanical decoupling layer 12 disposed on the contact layer 11, a diffusion barrier layer 12 disposed on the mechanical decoupling layer 12 and an intermetallic layer 18 disposed on the diffusion barrier layer 12 and the upper surface 17 of the die pad 4.

After the semiconductor chip 2 has been attached to the die pad 4, the contact pads on the upper surface of the semiconductor chip 2 are connected by bond wires 7 to the inner portion of the leadfingers. The semiconductor chip 2, die pad 4 and inner portions of the leadfingers are then encapsulated in epoxy resin 8 to form the semiconductor package 1.

REFERENCE NUMBERS 1 semiconductor package
2 semiconductor chip
3 leadframe
4 die pad
5 connection structure
6 leadfinger
7 bond wire
8 plastic housing
9 rear side of semiconductor chip
10 upper side of semiconductor chip
11 contact layer
12 mechanical decoupling layer
13 barrier layer
14 diffusion solder layer
15 TiN adhesion layer
16 Ti contact layer
17 upper surface of die pad
18 intermetallic phases

What is claimed is:

1. A connection structure for attaching a semiconductor chip to a metal substrate, comprising a plurality of electrically conducting layers arranged in a stack, the stack comprising:
    a contact layer for providing an ohmic contact to a semiconductor chip;
    at least one mechanical decoupling layer consisting essentially of Al or Ag and configured to mechanically decouple the semiconductor chip and the substrate;
    at least one diffusion barrier layer configured to prevent diffusion between the mechanical decoupling layer and an adjacent layer;
    a diffusion solder layer configured to provide a diffusion soldered mechanical bond and an electrical connection to a metal substrate, wherein the diffusion solder layer consists essentially of a diffusion solder material which forms intermetallic phases with the material of the metal substrate at a temperature of approximately 230° C. to approximately 280° C.;
    wherein the at least one mechanical decoupling layer is positioned in the stack between one of the at least one diffusion barrier layer and the contact layer, and
    wherein the at least one diffusion barrier layer includes two diffusion barrier layers and the at least one mechanical decoupling layer is positioned between and is in direct contact with the two diffusion barrier layers.

2. A connection structure according to claim 1, wherein the contact layer comprises Ti or Ni or Au or Pt or Cu or Pd, and the at least one diffusion barrier layer comprises Ti or Ti and TiN.

3. A connection structure according to claim 1, wherein the diffusion solder layer comprises AuSn or AgSn or InSn or CuSn.

4. A connection structure according to claim 1, wherein the contact layer has a thickness of less than 1 gm, the at least one mechanical decoupling layer has a thickness of 0.1 gm to 10 um, the at least one diffusion barrier layer has a thickness of less than 0.1 um and the diffusion solder layer has a thickness of less than 10 gm.

5. A semiconductor chip, wherein a connection structure according to claim 1 is disposed on its rear side and wherein the contact layer is disposed on the rear side of the semiconductor chip.

6. A semiconductor chip according to claim 5, wherein the semiconductor chip comprises a vertical power device, the vertical power device being one of the group consisting of an IGBT, a MOSFET, a Schottkey-Diode and a PIN-Diode.

7. The connection structure of claim 1, wherein the at least one mechanical decoupling layer consists essentially of Al.

8. The connection structure of claim 1, wherein the at least one mechanical decoupling layer consists essentially of Ag.

9. A connection structure for attaching a semiconductor chip to a metal substrate, comprising a plurality of electrically conducting layers arranged in a stack, the stack comprising:
    a contact layer for providing an ohmic contact to a semiconductor chip;
    at least one mechanical decoupling layer consisting essentially of Al or Ag and configured to mechanically decouple the semiconductor chip and the substrate;
    at least one diffusion barrier layer configured to prevent diffusion between the mechanical decoupling layer and an adjacent layer; and
    a diffusion solder layer configured to provide a diffusion soldered mechanical bond and an electrical connection to a metal substrate, wherein the diffusion solder layer consists essentially of a diffusion solder material which forms intermetallic phases with the material of the metal substrate at a temperature of approximately 230° C. to approximately 280° C.,
    wherein the at least one mechanical decoupling layer is positioned in the stack between the at least one diffusion barrier layer and the contact layer, and
    wherein the at least one mechanical decoupling layer behaves as a liquid.

10. The connection structure of claim 9, wherein the at least one mechanical decoupling layer is in direct contact with the at least one diffusion barrier layer and with the contact layer.

11. The connection structure of claim 9, wherein the contact layer comprises Ti or Ni or Au or Pt or Cu or Pd, and the at least one diffusion barrier layer comprises Ti or Ti and TiN.

12. The connection structure of claim 9, wherein the diffusion solder layer comprises AuSn or AgSn or InSn or CuSn.

13. A connection structure according to claim 9, wherein the contact layer has a thickness of less than 1 gm, the at least one mechanical decoupling layer has a thickness of 0.1 gm to 10 um, the at least one diffusion barrier layer has a thickness of less than 0.1 um and the diffusion solder layer has a thickness of less than 10 gm.

14. The connection structure of claim 9, wherein the at least one mechanical decoupling layer consists essentially of Al.

15. The connection structure of claim 9, wherein the at least one mechanical decoupling layer consists essentially of Ag.

* * * * *

UNITED STATES PATENT AND TRADEMARK OFFICE
CERTIFICATE OF CORRECTION

PATENT NO. : 8,084,861 B2  
APPLICATION NO. : 11/460170  
DATED : December 27, 2011  
INVENTOR(S) : Ralf Otremba Page 1 of 1

It is certified that error appears in the above-identified patent and that said Letters Patent is hereby corrected as shown below:

In Column 8, Claim 4:
In lines 24, 25 and 28, replace "gm" with --μm--
In lines 26 and 27, replace "um" with --μm--

In Column 9, Claim 13:
In lines 7 and 8, replace "gm" with --μm--

In Column 10, Claim 13:
In lines 1 and 2, replace "um" with --μm--
In line 3, replace "gm" with --μm--

Signed and Sealed this  
Twelfth Day of June, 2012

David J. Kappos  
*Director of the United States Patent and Trademark Office*